(12) United States Patent
Sasaki et al.

(10) Patent No.: US 8,102,050 B2
(45) Date of Patent: Jan. 24, 2012

(54) SEMICONDUCTOR DEVICE AND THE METHOD OF MANUFACTURING THE SAME

(75) Inventors: Koji Sasaki, Matsumoto (JP); Kazuo Matsuzaki, Sendai (JP); Takashi Kobayashi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 165 days.

(21) Appl. No.: 12/243,477

(22) Filed: Oct. 1, 2008

(65) Prior Publication Data

US 2009/0174076 A1    Jul. 9, 2009

(30) Foreign Application Priority Data

Oct. 2, 2007   (JP) .................. 2007-258649

(51) Int. Cl.
*H01L 23/48* (2006.01)
(52) U.S. Cl. ............... 257/751; 257/E23.01
(58) Field of Classification Search ........... 257/751, 257/758, 759, E23.01
See application file for complete search history.

(56) References Cited

U.S. PATENT DOCUMENTS 7,416,932 B2 *   8/2008 Itou .................. 438/197

FOREIGN PATENT DOCUMENTS

| JP | 2001-068473 A | 3/2001 |
| JP | 2004-079852 A | 3/2004 |

* cited by examiner

*Primary Examiner* — Hoa B Trinh
(74) *Attorney, Agent, or Firm* — Rossi, Kimms & McDowell LLP

(57) ABSTRACT

A semiconductor device includes a semiconductor substrate; a metal electrode wiring laminate on the semiconductor substrate, the metal electrode wiring laminate being patterned with a predetermined wiring pattern; the metal electrode wiring laminate including an undercoating barrier metal laminate and aluminum or aluminum alloy film on the undercoating barrier metal laminate; and organic passivation film covering the metal electrode wiring laminate, wherein the barrier metal laminate is a three-layered laminate including titanium films sandwiching a titanium nitride film. The semiconductor device according to the invention facilitates improving the moisture resistance of the portion of the barrier metal laminate exposed temporarily in the manufacturing process, facilitates employing only one passivation film, facilitates preventing the failures caused by cracks from occurring and the failures caused by Si nodules remaining in the aluminum alloy from increasing.

5 Claims, 5 Drawing Sheets

SEMICONDUCTOR DEVICE AND THE METHOD OF MANUFACTURING THE SAME

BACKGROUND OF THE INVENTION

The present invention relates to a semiconductor device used in semiconductor integrated circuits and the method for manufacturing the semiconductor device. Specifically, the invention relates to a semiconductor device that has a multi-layered electrode structure including a metal electrode wiring laminate formed on a semiconductor substrate and having a predetermined wiring pattern. The metal electrode wiring laminate includes an undercoating barrier metal laminate and an aluminum film or an aluminum alloy film formed on the undercoating barrier metal laminate. The metal electrode wiring laminate is covered with a passivation film. Specifically, the invention further relates to the method for manufacturing the semiconductor device having the multilayered electrode structure described above.

The method for manufacturing the semiconductor device having a conventional multilayered electrode structure will be described below focusing especially on the method for forming the conventional multilayered electrode structure relevant to the present invention. The conventional multilayered electrode structure includes a metal electrode wiring laminate including a barrier metal laminate, formed of a Ti film and a TiN film, and an Al—Si alloy film on the barrier metal laminate. An organic passivation film formed of a polyimide film is coated on the metal electrode wiring laminate.

The manufacturing process flow, along which the manufacture of the conventional multilayered electrode structure, will be described with reference to FIGS. 3(a) through 3(e) and FIGS. 4(f) through 4(i). In the following descriptions, titanium, aluminum and silicon will be designated sometimes by the respective atomic symbols, Ti, Al and Si.

As described in FIG. 3(a), Ti film 3 and TiN film 4 are formed by sputtering as the constituent films of the barrier metal laminate in the order of the above descriptions thereof from the side of a silicon substrate, in which semiconductor functional regions not shown are formed. An Al—Si alloy film 2 is then laminated on TiN film 4 (step (a)). A photoresist 1 is formed on Al—Si alloy film 2 and photoresist 1 is patterned as described in FIG. 3(b) to form a predetermined wiring pattern (step (b)). Then, Al—Si alloy film 2 is etched by wet etching with a mixed acid (nitric acid:acetic acid:phosphoric acid=1-10:1-20:10-40 (in the volume ratio)) at a liquid temperature of 40-80☐ using patterned photoresist 1 as a mask. As described in FIG. 3(c), Al—Si alloy film 2 is side-etched to the underside of photoresist 1 working as a mask. Si nodules 5 (Si particles and such particle residues caused by etching Al—Si alloy film 2) shown by open circles in FIG. 3(c) remain on the barrier metal laminate surface, from which Al—Si alloy film 2 is removed by the etching. Si nodules 5 are caused also in the aluminum alloy film (step (c)). The Si nodules 5, which remain on the barrier metal laminate surface, are removed as described in FIG. 3(d) by plasma etching using a fluorine-containing gas as a main etching gas. The plasma etching conditions include the $CF_4$ gas flow rate of 100 to 500 sccm, the $O_2$ gas flow rate of 5 to 50 sccm, the pressure inside a chamber of 66.66 to 199.98 Pa, the plasma electric power of 0.2 to 2.0 W/cm², and the wafer temperature of 30 to 90☐ (step (d)). Then, as described in FIG. 3(e), Ti film 3 and TiN film 4 are etched and removed by dry etching with a chlorine-containing gas as a main etching gas using photoresist 1 for a mask. The dry etching conditions include the $BCl_3$ gas flow rate of 30 to 80 sccm, the $Cl_2$ gas flow rate of 30 to 80 sccm, the $N_2$ gas flow rate of 0 to 30 sccm, the pressure inside a chamber of 19.99 to 39.99 Pa, the plasma electric power of 400 to 1000 W/cm², the cathode electrode temperature of 50 to 100☐, and the wall electrode temperature of 50 to 100☐. As described above, Al—Si alloy film 2 is set back from the pattern edge of photoresist 1. However, Ti film 3 and TiN film 4 are etched such that Ti film 3 and TiN film 4 are patterned with the pattern of photoresist 1. Therefore, the surface of TiN film 4, which is the uppermost constituent film of the barrier metal laminate, is exposed in the area, from which Al—Si alloy film 2 has been etched and removed (step (e)).

The photoresist 1 is then burned to ashes and removed as described in FIG. 4(f) (step (f)). Then, a heat treatment is conducted to sinter Ti film 3, TiN film 4 and Al—Si alloy film 2. As Ti film 3, TiN film 4 and Al—Si alloy film 2 are sintered, Si nodules 5 in the aluminum alloy grow as described in FIG. 4(g). The growth of Si nodules 5 is illustrated by larger open circles in FIG. 4(g). Si nodules 5 grow to be larger as the heat treatment temperature is higher and as the heat treatment time is longer (step (g)). Then, SiN film 8 is coated to protect exposed Ti film 3 and TiN film 4 from moistures as described in FIG. 4(h) (step (h)). The polyimide film 7 is then coated to protect the semiconductor device surface as described in FIG. 4(i) (step (i)).

Manufacturing steps, almost identical to the steps (a) through (g) for forming the multilayered electrode structure described above, are described in the following Unexamined Laid Open Japanese Patent Application Publication No. 2004-79582. The semiconductor device, having a multilayered electrode structure that includes an Al—Si alloy film on a barrier metal laminate formed of a Ti film, a TiON film on the Ti film, and a Ti-film on the TiON film, is disclosed in the following Unexamined Laid Open Japanese Patent Application Publication No. 2001-68473.

In the manufacturing process described above in the section of background and in the manufacturing process described in Publication No. 2004-79582, the barrier metal laminate surface is exposed widely. As shown in FIGS. 3(e), 4(f) and 4(g), a widely exposed area is caused in the barrier metal laminate surface due to the removal of Al—Si film 2 therefrom by the wet etching. When the barrier metal laminate exhibits poor moisture resistance, it is necessary to protect the exposed surface area of the barrier metal laminate with a passivation film such as a silicon nitride film (hereinafter referred to as a "SiN film") that exhibits excellent moisture resistance. Although the SiN film exhibits excellent moisture resistance, defects such as cracks are liable to be caused in the SiN film by the surface stress due to the thermal expansion coefficient difference between the SiN film and the silicon substrate. For a countermeasure against the detect formation, it is necessary to further laminate an organic passivation film such as a polyimide film on the SiN film. As a result, it is necessary for the conventional manufacturing processes to form two passivation films. The formation of two passivation films makes the manufacturing costs soar inevitably. A large stress is exerted to the SiN film surface as described above. When the SiN film is combined a thin silicon wafer, a large warp is caused in the thin silicon wafer. It is impossible to make the warped silicon wafer flow through the subsequent manufacturing steps. The Si nodules caused in the Al—Si alloy film grow to be larger as the heat treatment temperature is higher when the TiN film is on the surface side in the barrier metal laminate. The large Si nodules cause start points in the SiN film, from which cracks are caused in the wire bonding step in the assembly process, further causing failure increase.

In view of the foregoing, it would be desirable to provide a device and method that obviates the problems described above. It would further be desirable to provide a semiconductor device, including a metal electrode wiring laminate, which facilitates improving the moisture resistance of the exposed portion of the barrier metal laminate including a TiN film on the surface side therein. It would also be desirable to provide a semiconductor device, including a metal electrode wiring laminate and one passivation film protecting the metal electrode wiring laminate, which facilitates preventing the cracks due to the Si nodule growth from causing in the aluminum alloy film. It would still further be desirable to provide the method of manufacturing a semiconductor device, including a metal electrode wiring laminate, that facilitates preventing the failures caused by the cracks due to the Si nodule growth from increasing.

SUMMARY OF THE INVENTION

The invention provides a device and method that obviates the problems described above. Specifically, the invention provides a semiconductor device, including a metal electrode wiring laminate, which facilitates improving the moisture resistance of the exposed portion of the barrier metal laminate including a TiN film on the surface side therein. Further, the invention provides a semiconductor device, including a metal electrode wiring laminate and one passivation film protecting the metal electrode wiring laminate, which facilitates preventing the cracks due to the Si nodule growth from causing in the aluminum alloy film. Still further, the invention provides a method of manufacturing a semiconductor device, including a metal electrode wiring laminate, that facilitates preventing the failures caused by the cracks due to the Si nodule growth from increasing.

In one preferred embodiment, a semiconductor device includes a semiconductor substrate, a metal electrode wiring laminate including an undercoating barrier metal laminate and an aluminum film or an aluminum alloy film on the barrier metal laminate, the metal electrode wiring laminate being patterned with a predetermined wiring pattern, an organic passivation film covering the metal electrode wiring laminate, and the barrier metal laminate including titanium films and a titanium nitride film between the titanium films.

The uppermost one of the titanium films is preferably from 20 nm to 100 nm in thickness, the aluminum film or the aluminum alloy film is preferably 3 μm or more in thickness, the organic passivation film is preferably a polyimide film in the semiconductor device, the semiconductor substrate is preferably a silicon semiconductor substrate, and the aluminum alloy film is preferably an aluminum-silicon alloy film.

In another preferred embodiment, a method of manufacturing a semiconductor device is provided that includes forming a barrier metal laminate on a semiconductor substrate, the barrier metal laminate including titanium films and a titanium nitride film between the titanium films, forming an aluminum film or an aluminum alloy film on the uppermost one of the titanium films in the barrier metal laminate, etching the aluminum film or the aluminum alloy film by wet etching using a mixed acid for patterning the aluminum film or the aluminum alloy film with a predetermined wiring pattern, etching the residue remaining on the exposed surface of the barrier metal laminate by plasma etching using a mixed gas containing a fluorine-containing gas for removing the residue, etching the barrier metal laminate by plasma etching using a mixed gas containing a chlorine-containing gas for patterning the barrier metal laminate with the predetermined wiring pattern, and coating an organic passivation film.

The mixed acid preferably contains nitric acid and acetic acid or the mixed acid preferably contains nitric acid, acetic acid, and phosphoric acid, the uppermost one of the titanium films is preferably from 20 nm to 100 nm in thickness, the aluminum film or the aluminum alloy film is preferably 3 μm or more in thickness, the semiconductor substrate is preferably a silicon semiconductor substrate, and the aluminum alloy film is preferably an aluminum-silicon alloy film.

An uppermost Ti film is added to the barrier metal laminate including a Ti film and a TiN film on the Ti film.

The semiconductor device according to the invention has a multilayered electrode structure including a three-layered barrier metal laminate, formed of a Ti film, a TiN film on the Ti film, and a Ti film on the TiN film, and an Al film or an Al—Si alloy film laminated on the three-layered barrier metal laminate. Even if the undercoating barrier metal laminate is exposed as the Al film or the Al—Si alloy film is set back by side etching, the exposed barrier metal laminate will be protected by the uppermost Ti film exhibiting excellent moisture resistance. Since the Ti atoms in the uppermost surface portion of the barrier metal laminate react with the Si atoms in the aluminum alloy film, producing titanium silicides, the Si atoms in the Al—Si alloy film do not cause Si nodules. Therefore, Si nodules larger than 1 μm in diameter will not be caused by the heat treatment conducted at a high-temperature for a long time after the electrode wiring formation. Moreover, since any SiN film is not employed, the cracks that may be caused in the SiN film by the wire bonding conducted in the assembly process are prevented from occurring. Therefore, the failures caused by the cracks are reduced.

According to the invention, a semiconductor device including a metal electrode wiring laminate and the method of manufacturing the semiconductor device are obtained. The metal electrode wiring laminate according to the invention facilitates improving the moisture resistance of the exposed portion of the barrier metal laminate thereof. The metal electrode wiring laminate according to the invention facilitates preventing the failures due to the cracks from causing even when the passivation film is single-layered. The metal electrode wiring laminate according to the invention also facilitates preventing the failures caused by the growth of the Si nodules remaining in the aluminum alloy from increasing.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Now the process flow for manufacturing the semiconductor device according to a first embodiment that includes a metal electrode wiring laminate including a barrier metal laminate, formed of a Ti film, a TiN film on the Ti film, a Ti film on the TiN film, and an Al—Si film on the barrier metal laminate will be described below with reference to FIGS. 1(*a*) through 1(*d*) and FIGS. 2(*e*) through 2(*h*). The semiconductor device and the manufacturing method thereof according to the first embodiment are the same with the conventional semiconductor device and the conventional manufacturing method thereof in many aspects. Therefore, duplicated descriptions on the semiconductor device and the manufacturing method thereof according to the first embodiment will be avoided. In other words, the semiconductor device and the manufacturing method thereof according to the first embodiment will be described mainly in connection with the differences thereof from the semiconductor device that includes the conventional metal electrode wiring laminate and the conventional manufacturing method.

As described in FIG. 1(*a*), a metal electrode wiring laminate including Ti film 3, TiN film 4, Ti film 9, and Al—Si film 2 is formed by sputtering on a not-shown silicon substrate (step (a)). Ti film 3, TiN film 4, and Ti film 9 are called collectively as a "barrier metal laminate". An Al film may be used in substitution for Al—Si film 2. It is preferable for the Al film or Al—Si film 2 to be 3 μm or more in thickness. Ti film 9, the third film on the silicon substrate side, is formed to be 20 nm to 100 nm in thickness. The preferable thickness range for Ti film 9 will be described below.

Figure 1A:
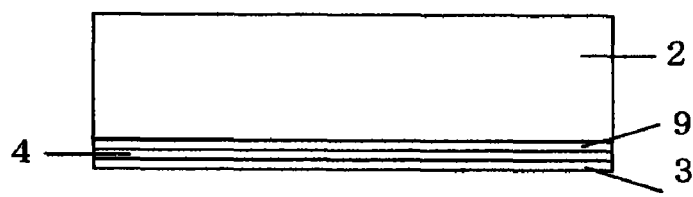
FIGS. 1(a) through 1(d) are cross sectional views describing the steps (a) through (d) for manufacturing a metal electrode wiring laminate in a semiconductor device according to the invention.
Figure 1B:
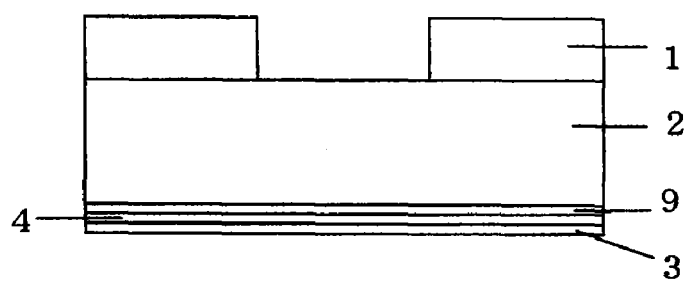
Figure 1C:
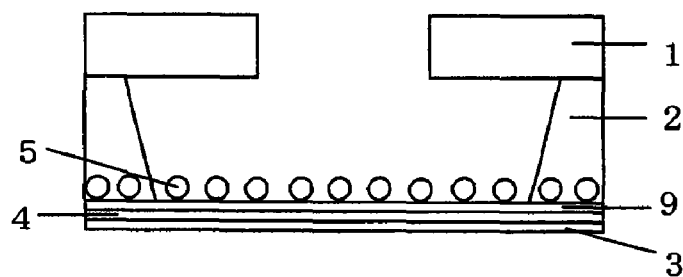
Figure 1D:
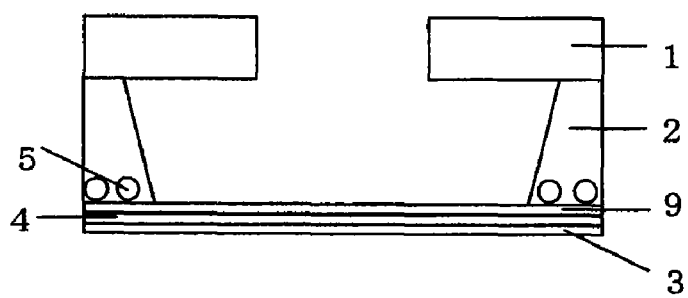
Figure 2E:
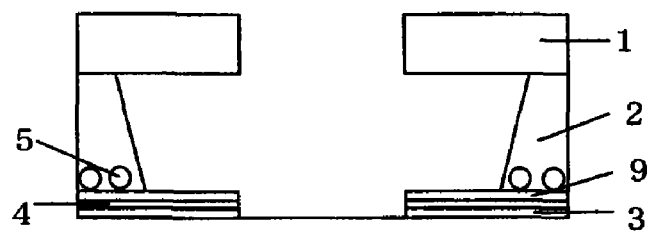
FIGS. 2(e) through 2(h) are cross sectional views describing the steps (e) through (h) for manufacturing the metal electrode wiring laminate in the semiconductor device according to the invention.
Figure 2F:
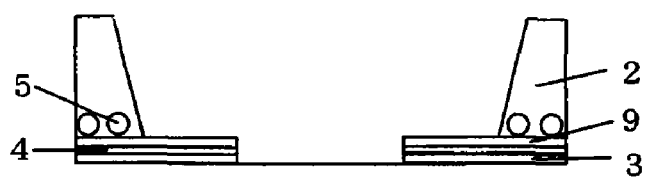
Figure 2G:
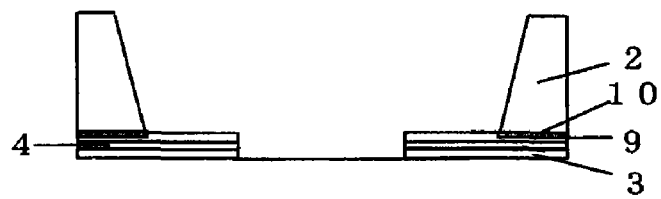
Figure 2H:
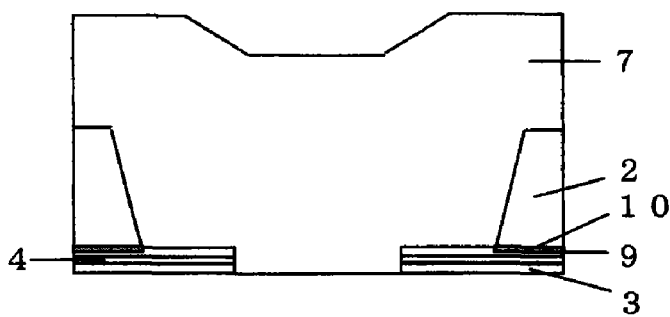
Figure 3A:
FIGS. 3(a) through 3(e) are cross sectional views describing the steps (a) through (e) for manufacturing a metal electrode wiring laminate in a semiconductor device according to the prior art.
Figure 3B:
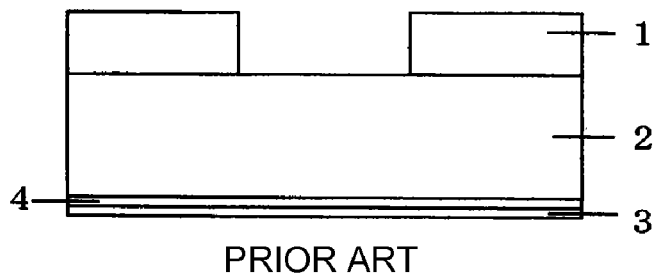
Figure 3C:
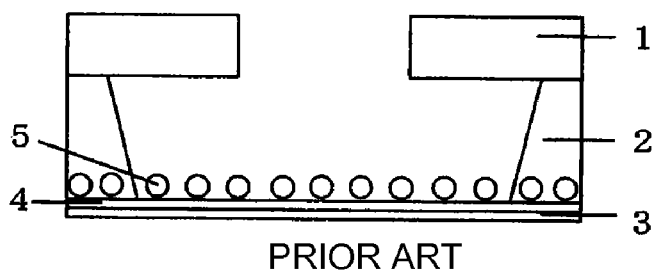
Figure 3D:
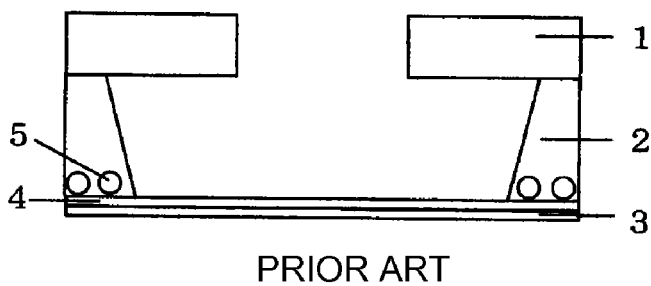
Figure 3E:
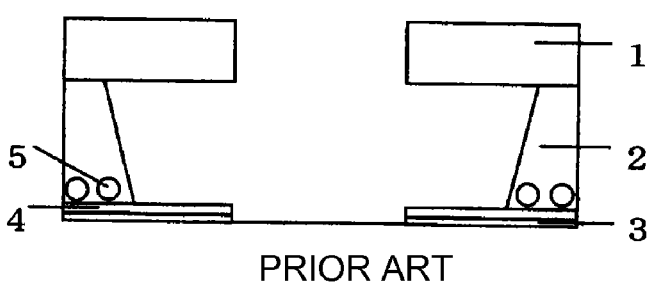
Figure 4F:
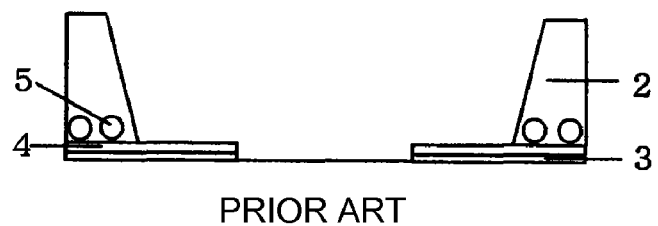
FIGS. 4(f) through 4(i) are cross sectional views describing the steps (f) through (i) for manufacturing the metal electrode wiring laminate in the semiconductor device according to the prior art.
Figure 4G:
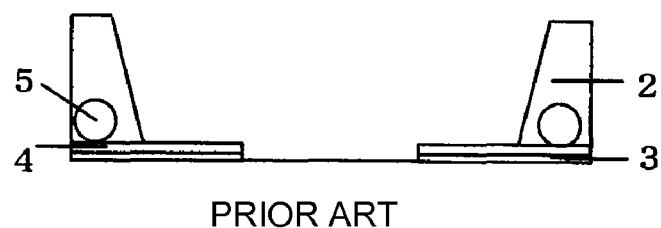
Figure 4H:
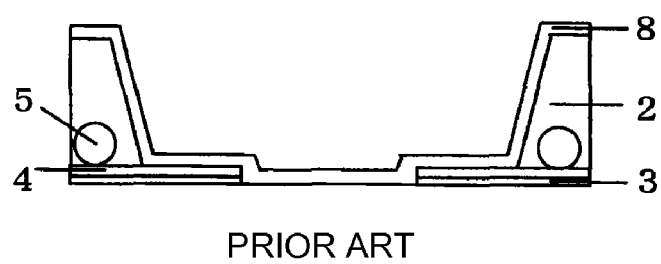
Figure 4I:
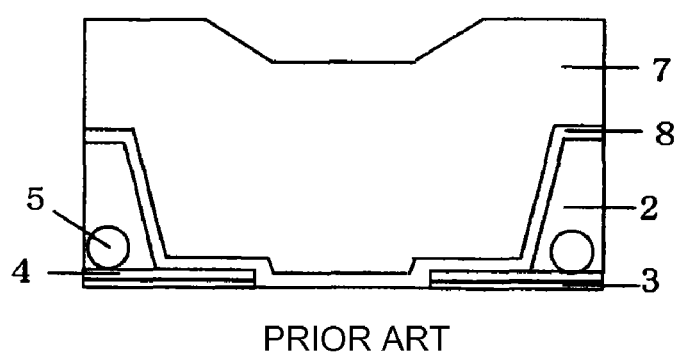
Figure 5:
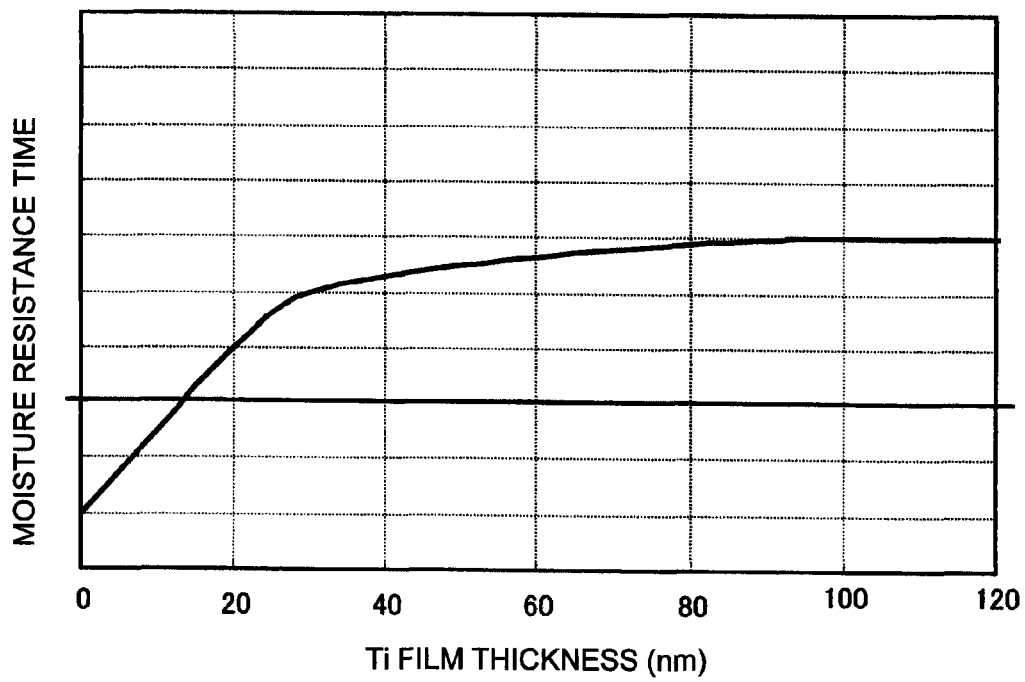
FIG. 5 is a graph relating the thickness of an uppermost Ti film in a three-layered barrier metal laminate with the corrosiveness thereof.

FIG. 5 describes the correlation between the thickness of Ti film 9 and the period of time that elapses before a failure is caused by corrosion. In the corrosion resistance test, corrosions are caused in a very humid environment. Therefore, the period of time that elapses before a failure is caused by corrosion will be referred to hereinafter as the "moisture resistance time". In FIG. 5, the horizontal axis represents the thickness of Ti film 9 and the vertical axis the moisture resistance times. When Ti film 9 is thinner than 20 nm, the moisture resistance time is close to or shorter than the guarantee time as described in FIG. 5. Therefore, sufficient moisture resistance cannot be secured, when Ti film 9 is thinner than 20 nm. When Ti film 9 is set to be more than 100 nm in thickness, the moisture resistance tends to saturate. In other words, it is almost hard for Ti film 9, more than 100 nm in thickness, to further improve the moisture resistance thereof. Therefore, it is preferable to set the thickness of Ti film 9 in the range between 20 nm and 100 nm. The environmental conditions for the corrosion test includes the load conditions of 120☐ and 85 RH and the applied voltage of 80% of the rated Vce. The failure is defined by the increase of the reverse leakage current between the collector and the emitter that exceeds a predetermined value. The test time that elapses until the above-defined failure is caused is described as the moisture resistance time in FIG. 5.

Figure 6:
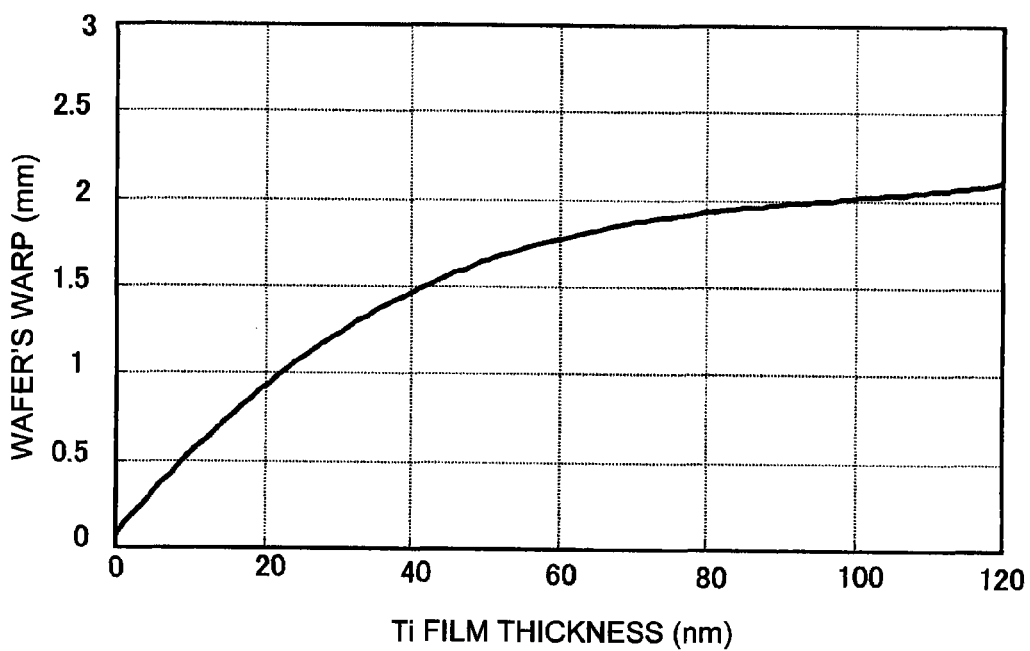
FIG. 6 is a graph relating the thickness of the uppermost Ti film in the three-layered barrier metal laminate with the warp of a silicon wafer.

As FIG. 6 indicates, the warps caused in the wafer in the Ti film thickness range between 20 nm and 100 nm are from 1 mm to 2 mm, falling almost within the device limit of 2 mm. The wafer thickness in FIG. 6 is, for example, 140 μm and the wafer diameter is, for example, 150 mm. When a wafer, the thickness thereof has been reduced to be 140 μm in the preceding wafer process, is warping for 2 mm or more, the wafer may be brought into contact with transportation equipments in the subsequent wafer process. The transportation equipments include a spin coater (coating equipment) for coating a polyimide film and a spin etcher. As a result, the wafer may be broken by the contact. Therefore, the wafer warping for 2 mm or more can not be made to flow through the subsequent process. The limit, beyond which the troubles as described above will be caused, is referred to as the "device limit".

The photoresist 1 is then coated on Al—Si film 2 and photoresist 1 is patterned with a predetermined wiring pattern in the same manner as described with reference to FIG. 3(*b*) (step (b)).

As described in FIG. 1(*c*), Al—Si alloy film 2, 3 μm or more in thickness, is etched by wet etching in the same manner as described with reference to FIG. 3(*c*) with a mixed acid (containing nitric acid, acetic acid, and phosphoric acid) using patterned photoresist 1 for a mask (step (c)). Since the an isotropic etching caused by the wet etching is small, Al—Si alloy film 2 is etched in the thickness direction thereof from the opening of photoresist 1. Al—Si alloy film 2 is etched also laterally (in the width direction) to the underside of photoresist 1, resulting in side etching. After the etching of Al—Si alloy film 2 is over, Si nodules 5 remain on the surface of Ti film 9, the uppermost layer of the exposed barrier metal laminate below Al—Si alloy film 2. In the same manner, Si nodules 5 are caused also in Al—Si alloy film 2.

As described in FIG. 1(*d*), Si nodules 5 remaining on the surface of Ti film 9 are removed in the same manner as described with reference to FIG. 3(*d*) by plasma etching using a fluorine-containing gas as a main etching gas (step (d)).

As described in FIG. 2(*e*), the three-layered barrier metal laminate including Ti film 3, TiN film 4 and Ti film 9 is etched and patterned in the same manner as described with reference to FIG. 3(*e*) by dry etching using a chlorine-containing gas as a main etching gas and photoresist 1 as a mask (step (e)). Since Al—Si alloy film 2 is etched off for a certain distance from the pattern edge of photoresist 1 by the side etching described above, the barrier metal laminate is exposed partly. Since Ti film 9 is on the upper surface side of the barrier metal laminate, the moisture resistance of the barrier metal laminate is secured according to the first embodiment in contrast to the conventional barrier metal laminate. Since Ti film 9 is added to the upper surface side of the barrier metal laminate according to the first embodiment, it is not necessary to add many more steps for securing the moisture resistance of the barrier metal laminate. Since Ti film 9 is formed subsequently to forming the TiN film, it is not necessary to prepare a new mask.

As described in FIG. 2(*f*), the photoresist 1 is burned to ashes with oxygen plasma (step (f)).

As described in FIG. 2(*g*), a heat treatment is conducted to sinter Ti film 3, TiN film 4, Ti film 9 and Al—Si alloy film 2 (step (g)). The heat treatment makes Si nodules 5 remaining in Al—Si alloy film 2 react with Ti film 9 below Al—Si alloy film 2, forming titanium silicide ($Ti_xSi$) 10. Therefore, Si nodules 5 are reduced in the number thereof as well as in the size thereof.

As described in FIG. 2(*h*), polyimide film 7 is formed as a passivation film (protection film) (step (h)).

The semiconductor device according to the invention includes a metal electrode wiring laminate including a three-layered barrier metal laminate, formed of Ti film 3, TiN film 4, and Ti film 9, and Al—Si alloy film 2. Since Ti film 9 is on the upper surface side of the barrier metal laminate below Al—Si alloy film 2, the portion of the barrier metal laminate, which will be exposed by the etching for forming the electrode wiring, is covered with Ti film 9. Therefore, the corrosion resistance (moisture resistance) of the portion of the barrier metal laminate, which will be exposed by the etching for forming the electrode wiring, is improved by a small number of manufacturing steps. Since Si nodules 5 are prevented from causing in Al—Si alloy film 2 according to the invention, cracks are prevented from causing in the wire bonding step.

While the present invention has been particularly shown and described with reference to the preferred embodiment thereof, it will be understood by those skilled in the art that the foregoing and other changes in form and details can be made without departing from the spirit and scope of the present invention. All modifications and equivalents attainable by one versed in the art from the present disclosure within the scope and sprit of the present invention are to be included as further embodiments of the invention. The scope of the present invention accordingly is to be defined as set forth in the appended claims.

This application is based on, and claims priority to, Japanese Patent Application No: 2007-258649, filed on Oct. 2, 2007. The disclosure of the priority application, in its entirety, including the drawings, claims, and the specification thereof, is incorporated herein by reference.

What is claimed is:

1. A semiconductor device comprising:
   a semiconductor substrate;
   a metal electrode wiring laminate on the semiconductor substrate, the metal electrode wiring laminate including an undercoating barrier metal laminate and an aluminum film or an aluminum alloy film on the undercoating barrier metal laminate, the metal electrode wiring laminate being patterned with a predetermined wiring pattern; and
   an organic passivation film covering the patterned metal electrode wiring laminate, exposed portions of the undercoating barrier metal laminate, and portions of the substrate not covered by the predetermined wiring pattern;
   wherein the undercoating barrier metal laminate comprises a titanium nitride film sandwiched between two titanium films and the aluminum or aluminum alloy film is formed on the uppermost titanium film.

2. The semiconductor device according to claim 1, wherein an uppermost one of the titanium films is from 20 nm to 100 nm in thickness.

3. The semiconductor device according to claim 1, wherein the aluminum film or the aluminum alloy film is 3 μm or more in thickness.

4. The semiconductor device according to claim 1, wherein the organic passivation film comprises a polyimide film.

5. The semiconductor device according to claim 1, wherein the semiconductor substrate comprises a silicon semiconductor substrate and the aluminum alloy film comprises an aluminum-silicon alloy film.

* * * * *